(12) United States Patent
Chen et al.

(10) Patent No.: US 11,670,198 B2
(45) Date of Patent: Jun. 6, 2023

(54) FLEXIBLE DISPLAY PANEL AND ROLLABLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Jianfeng Chen, Hubei (CN); Shuyuan Zhang, Hubei (CN)

(73) Assignee: WUHAN CHINA STAR OPTOELECTRONICS SEMICONDUCTOR DISPLAY TECHNOLOGY CO., LTD, Hubei (CN)

( * ) Notice: Subject to any disclaimer, the term of this patent is extended or adjusted under 35 U.S.C. 154(b) by 317 days.

(21) Appl. No.: 17/265,868

(22) PCT Filed: Sep. 11, 2020

(86) PCT No.: PCT/CN2020/114648
§ 371 (c)(1),
(2) Date: Feb. 4, 2021

(87) PCT Pub. No.: WO2022/027779
PCT Pub. Date: Feb. 10, 2022

(65) Prior Publication Data
US 2022/0309963 A1    Sep. 29, 2022

(30) Foreign Application Priority Data

Aug. 6, 2020   (CN) .......................... 202010784184.0

(51) Int. Cl.
*G09F 9/30*   (2006.01)
*H01L 27/12*   (2006.01)
(Continued)

(52) U.S. Cl.
CPC .......... *G09F 9/301* (2013.01); *H01L 27/1218* (2013.01); *H10K 59/123* (2023.02); *H10K 59/131* (2023.02)

(58) Field of Classification Search
None
See application file for complete search history.

(56) References Cited

U.S. PATENT DOCUMENTS 10,360,825 B1 *   7/2019   Wu ..................... H01L 27/1218
10,366,636 B2 *   7/2019   Wang ................... H01L 51/0097
(Continued)

FOREIGN PATENT DOCUMENTS

CN   104795403 A   7/2015
CN   106601133 A   4/2017
(Continued)

*Primary Examiner* — Vinh T Lam
(74) *Attorney, Agent, or Firm* — PV IP PC; Wei Te Chung; Zhigang Ma (57) ABSTRACT

A flexible display panel and a rollable display device are provided. The flexible display panel includes: a base substrate having a display region, a pixel circuit disposed on the base substrate and located in the display region, and a first via hole defined in the display region. Wherein, at least one of the first via holes is provided between two adjacent pixel circuits.

18 Claims, 4 Drawing Sheets

(51) Int. Cl.
*H10K 59/123* (2023.01)
*H10K 59/131* (2023.01)

(56) References Cited

U.S. PATENT DOCUMENTS

| | | | | |
|---|---|---|---|---|
| 10,553,665 | B2* | 2/2020 | Hwang | H01L 27/3276 |
| 10,657,851 | B2* | 5/2020 | Wu | H01L 29/78603 |
| 10,756,126 | B2* | 8/2020 | Yuan | H01L 27/1218 |
| 10,950,677 | B2* | 3/2021 | Yu | H01L 27/1244 |
| 10,964,731 | B2* | 3/2021 | Hu | H01L 27/1248 |
| 10,985,228 | B2* | 4/2021 | Zhang | H01L 27/3262 |
| 11,119,538 | B2* | 9/2021 | Ma | G09G 3/36 |
| 11,139,363 | B2* | 10/2021 | Oh | H01L 27/323 |
| 11,195,859 | B2* | 12/2021 | Wu | H01L 27/1218 |
| 11,227,878 | B2* | 1/2022 | Hu | H01L 27/124 |
| 11,243,572 | B2* | 2/2022 | Zheng | H01L 51/0097 |
| 11,251,410 | B2* | 2/2022 | Zheng | H01L 51/003 |
| 11,271,056 | B2* | 3/2022 | Ouyang | H01L 27/3246 |
| 11,271,066 | B2* | 3/2022 | Hu | H01L 27/3276 |
| 11,296,128 | B2* | 4/2022 | Zhang | G02F 1/1333 |
| 11,302,764 | B2* | 4/2022 | Xu | G09G 3/3233 |
| 11,309,340 | B2* | 4/2022 | Zhao | H01L 27/1218 |
| 11,335,882 | B2* | 5/2022 | Wang | H01L 51/5253 |
| 11,342,519 | B2* | 5/2022 | Bu | H01L 51/56 |
| 11,362,289 | B2* | 6/2022 | Huang | H01L 27/3258 |
| 11,380,717 | B2* | 7/2022 | Lu | H01L 27/1259 |
| 11,495,648 | B2* | 11/2022 | Li | H01L 27/3258 |
| 11,508,803 | B2* | 11/2022 | Long | H01L 27/3248 |
| 11,532,246 | B2* | 12/2022 | Yan | G09F 9/301 |
| 2017/0262126 | A1* | 9/2017 | Yang | G06F 3/0445 |
| 2019/0267558 | A1* | 8/2019 | Wang | H01L 27/3262 |
| 2019/0355799 | A1* | 11/2019 | Jeong | H01L 27/3262 |
| 2020/0098291 | A1* | 3/2020 | Wu | H01L 27/1248 |
| 2020/0161572 | A1* | 5/2020 | Zheng | H01L 27/3246 |
| 2021/0020723 | A1* | 1/2021 | Park | H01L 27/3262 |
| 2021/0184140 | A1* | 6/2021 | Zhao | H01L 51/0097 |
| 2021/0226137 | A1* | 7/2021 | Zhao | H01L 51/0097 |
| 2021/0327922 | A1* | 10/2021 | Huang | H01L 27/1244 |

FOREIGN PATENT DOCUMENTS

| | | | | | |
|---|---|---|---|---|---|
| CN | 107425044 | A | * | 12/2017 | H01L 21/77 |
| CN | 107946247 | A | | 4/2018 | |
| CN | 107978612 | A | | 5/2018 | |
| CN | 108281386 | A | | 7/2018 | |
| CN | 108288637 | A | | 7/2018 | |
| CN | 109037244 | A | | 12/2018 | |
| CN | 109300964 | A | | 2/2019 | |
| CN | 109671719 | A | * | 4/2019 | G09F 9/301 |
| CN | 109671748 | A | * | 4/2019 | G09F 9/301 |
| CN | 109671761 | A | * | 4/2019 | H01L 27/3244 |
| CN | 109671762 | A | * | 4/2019 | G09F 9/301 |
| CN | 109755256 | A | * | 5/2019 | H01L 27/12 |
| CN | 109920332 | A | * | 6/2019 | H01L 27/1218 |
| CN | 110047381 | A | * | 7/2019 | H01L 27/3248 |
| CN | 110047381 | A | | 7/2019 | |
| CN | 110264878 | A | | 9/2019 | |
| CN | 110277428 | A | * | 9/2019 | G09F 9/301 |
| CN | 109192878 | B | * | 11/2019 | H01L 27/3251 |
| CN | 110620132 | A | | 12/2019 | |
| CN | 110649068 | A | * | 1/2020 | H01L 27/12 |
| CN | 111048566 | A | * | 4/2020 | G09F 9/301 |
| CN | 111063694 | A | * | 4/2020 | H01L 27/1218 |
| CN | 111063697 | A | | 4/2020 | |
| CN | 111180469 | A | * | 5/2020 | G01L 1/14 |
| CN | 111276519 | A | * | 6/2020 | G09F 9/301 |
| CN | 111276521 | A | * | 6/2020 | G09F 9/301 |
| CN | 111415968 | A | | 7/2020 | |
| CN | 111430417 | A | | 7/2020 | |
| WO | WO-2019100522 | A1 | * | 5/2019 | H01L 21/0273 |
| WO | WO-2020029464 | A1 | * | 2/2020 | H01L 21/77 |
| WO | WO-2020038018 | A1 | * | 2/2020 | H01L 27/1218 |
| WO | WO-2020191888 | A1 | * | 10/2020 | H01L 27/3248 |

* cited by examiner

FLEXIBLE DISPLAY PANEL AND ROLLABLE DISPLAY DEVICE

FIELD OF INVENTION

The present invention relates to the field of display technologies, and in particular, to a flexible display panel and a rollable display device.

BACKGROUND OF INVENTION

In the field of display technologies, flat-panel display devices such as liquid crystal display (LCD) devices and organic light-emitting diode (OLED) display devices have gradually replaced cathode ray tube (CRT) displays.

An LCD display device is composed of a thin film transistor array substrate (TFT array substrate) and a color filter (CF) substrate bonded together, and liquid crystals are filled between the TFT substrate and the CF substrate. Liquid crystal molecules are controlled to change directions by energizing them or not, and light from a backlight module is refracted to produce a picture.

OLEDs have many advantages such as self-luminescence, low driving voltage, high luminous efficiency, short response times, high definition and contrast, nearly 180° viewing angle, wide operating temperature range, flexible display, and large-area full-color display, etc., and are recognized by the industry as the most promising display devices. An OLED display device usually comprises: a substrate, an anode disposed on the substrate, a hole injection layer disposed on the anode, a hole transport layer disposed on the hole injection layer, a light emitting layer disposed on the hole transport layer, an electron transport layer disposed on the light emitting layer, an electron injection layer disposed on the electron transport layer, and a cathode disposed on the electron injection layer. A principle of luminescence is that semiconductor materials and organic luminescent materials are driven by an electric field to cause luminescence through carrier injection and recombination. With a current market trend, panels enter an era of flexibility. Related to a development of flexible panels, flexible foldable and rolling have become a mainstream direction of small-sized mobile phones, and flexible OLED display devices will be a mainstream market in the future. Among them, dynamic foldable (DF) and rollable products will become a top priority of small and medium display industries. A more stable structure is needed, and dynamic stretching and bending durability of flexible panels or materials need to be guaranteed. It is necessary to use accumulated technologies in a development of DF technology for rollable development feasibility. Therefore, it is necessary to reduce thicknesses, carry out line board design, and structure optimization for reduction of multi stress, in a bid to achieve performance durability and functional reliability of rollable display devices.

Technical Problem

In the prior art, flexible display panels have technical problems of insufficient dynamic stretching and bending durability, and rollable display devices have technical problems of insufficient performance durability and functional reliability.

Technical Solution

Embodiments of the present invention provide a flexible display panel and a rollable display device, which are used to solve technical problems in the prior art that insufficient dynamic stretch and bending durability of flexible display panels, and insufficient performance durability and functional reliability of rollable display devices.

In order to solve the above problems, in a first aspect, the present invention provides a flexible display panel comprising:

a base substrate, comprising a display region;

a pixel circuit disposed on the base substrate and located in the display region, wherein the pixel circuit comprises an active layer, a first gate metal layer, a second gate metal layer, and a first source-drain metal layer disposed in sequence;

a buffer layer disposed on a side of the active layer close to the base substrate;

a first gate insulating layer disposed between the active layer and the first gate metal layer;

a second gate insulating layer disposed between the first gate metal layer and the second gate metal layer;

an interlayer dielectric layer disposed between the second gate metal layer and the first source-drain metal layer; and a first via hole defined in the display region, wherein the first via hole passes through the buffer layer, the first gate insulating layer, the second gate insulating layer, and the interlayer dielectric layer;

wherein at least one of the first via holes is provided between two adjacent pixel circuits.

In some embodiments of the present invention, the first via hole is not filled or is provided with a first organic filling layer, and a material of the first organic filling layer is organic.

In some embodiments of the present invention, a surface of the first organic filling layer is covered with a passivation layer.

In some embodiments of the present invention, the first via hole is a continuous strip hole or a rectangular hole.

In some embodiments of the present invention, the base substrate further comprises a non-display region, and at least one of the first via holes is adjacent to a side of the non-display region.

In some embodiments of the present invention, the base substrate further comprises a non-display region, a plurality of second via holes are defined in the non-display region, and a second organic filling layer is disposed in the plurality of second via holes.

In some embodiments of the present invention, the second organic filling layer covers an inner wall of the second via hole, and a surface of the second organic filling layer is covered with a second source-drain metal layer.

In some embodiments of the present invention, each of the second source-drain metal layers corresponds to the plurality of second via holes in a same column, a width of the second via hole is greater than a width of the second source-drain metal layer, and a length of the second via hole is greater than a distance between adjacent second via holes.

In some embodiments of the present invention, the plurality of second via holes on adjacent rows or columns are interleaved with each other on the columns or the rows.

In a second aspect, the present invention provides a rollable display device, the rollable display device comprises a rotating shaft and a flexible display panel, wherein the flexible display panel comprises:

a base substrate comprising a display region;

a pixel circuit disposed on the base substrate and located in the display region, wherein the pixel circuit comprises an active layer, a first gate metal layer, a second gate metal layer, and a first source-drain metal layer disposed in sequence;

a buffer layer disposed on a side of the active layer close to the base substrate;

a first gate insulating layer disposed between the active layer and the first gate metal layer;

a second gate insulating layer disposed between the first gate metal layer and the second gate metal layer;

an interlayer dielectric layer disposed between the second gate metal layer and the first source-drain metal layer; and a first via hole defined in the display region, wherein the first via hole passes through the buffer layer, the first gate insulating layer, the second gate insulating layer, and the interlayer dielectric layer;

wherein at least one of the first via holes is provided between two adjacent pixel circuits.

In some embodiments of the present invention, the first via hole is not filled or is provided with a first organic filling layer, and a material of the first organic filling layer is organic.

In some embodiments of the present invention, a surface of the first organic filling layer is covered with a passivation layer.

In some embodiments of the present invention, the first via hole is a continuous strip hole or a rectangular hole.

In some embodiments of the present invention, the base substrate further comprises a non-display region, and at least one of the first via holes is adjacent to a side of the non-display region.

In some embodiments of the present invention, the base substrate further comprises a non-display region, a plurality of second via holes are defined in the non-display region, and a second organic filling layer is disposed in the plurality of second via holes.

In some embodiments of the present invention, the second organic filling layer covers an inner wall of the second via hole, and a surface of the second organic filling layer is covered with a second source-drain metal layer.

In some embodiments of the present invention, each of the second source-drain metal layers corresponds to the plurality of second via holes in a same column, a width of the second via hole is greater than a width of the second source-drain metal layer, and a length of the second via hole is greater than a distance between adjacent second via holes.

In some embodiments of the present invention, the plurality of second via holes on adjacent rows or columns are interleaved with each other on the columns or the rows.

Beneficial Effect

Compared with current flexible display panels and rollable display devices, the present invention provides a first via hole between two adjacent pixel circuits in a display region of a base substrate. When a flexible display panel is bent or rolled, stress is concentrated on the first via hole, so as to prevent the flexible display panel from being creased or damaged due to stress concentration. Meanwhile, a plurality of second via holes staggered in a non-display region can further release stress in the non-display region, improving dynamic stretch and bending durability of the flexible display panel, improving performance durability and functional reliability of a rollable display device, and improving product quality and production yield.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The following will clearly and completely describe the technical solutions in the embodiments of the present invention with reference to the drawings in the embodiments of the present invention. Obviously, the described embodiments are only a part of the embodiments of the present invention, rather than all the embodiments. Based on the embodiments in the present invention, all other embodiments obtained by those skilled in the art without creative work are within the protection scope of the present invention.

In the description of the present invention, it is to be understood that the terms "center," "longitudinal," "lateral," "length," "width," "thickness," "upper," "lower," "front," "rear," "left," "right," "vertical," "horizontal," "top," "bottom," "inner," "outer," "clockwise," "counterclockwise," and the like are used in the orientations and positional relationships indicated in the drawings for convenience in describing the present invention and for simplicity in description, and are not intended to indicate or imply that the referenced devices or elements must have a particular orientation, be constructed in a particular orientation, and be operated in a particular manner, and are not to be construed as limiting the present invention. Furthermore, the terms "first" and "second" are used for descriptive purposes only and are not to be construed as indicating or implying relative importance or implicitly indicating the number of technical features indicated. Thus, features defined as "first", "second", may explicitly or implicitly include one or more of the described features. In the description of the present application, "plurality" means two or more unless specifically limited otherwise.

In the prior art, flexible display panels have technical problems of insufficient dynamic stretching and bending durability, and rollable display devices have technical problems of insufficient performance durability and functional reliability.

Based on this, an embodiment of the present invention discloses a flexible display panel and a rollable display device. Detailed descriptions are given below.

Figure 1:
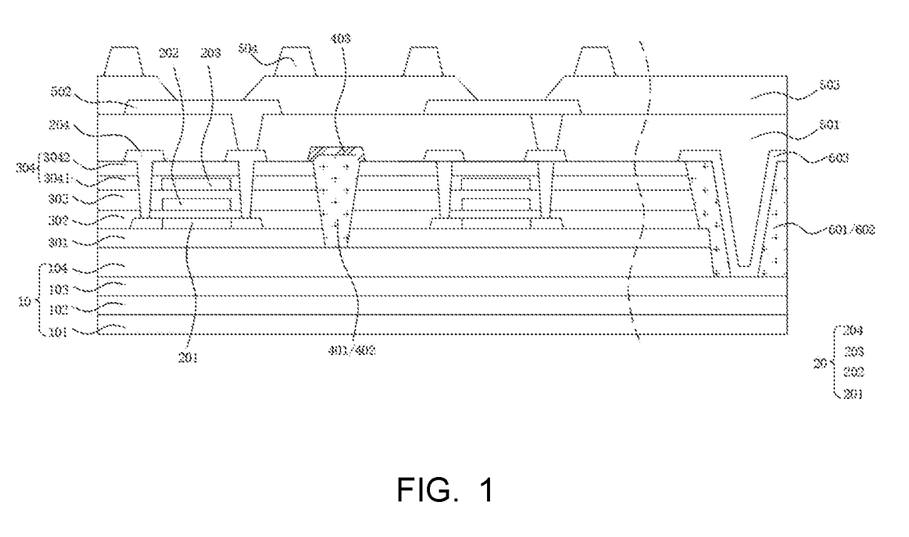
FIG. 1 is a schematic structural view of a flexible display panel in an embodiment of the present invention.
Figure 2:
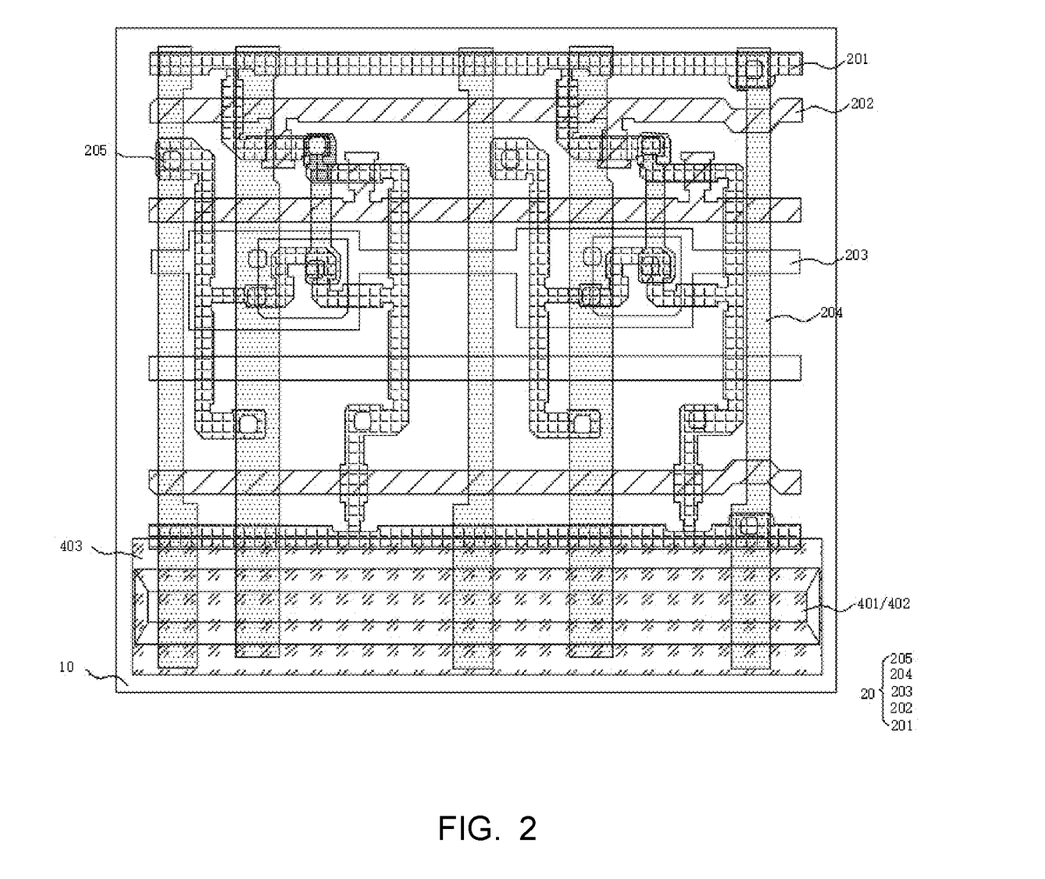
FIG. 2 is a schematic top view of a display region in the embodiment of the present invention.

First, the present invention provides the flexible display panel. As shown in FIG. 1 and FIG. 2. FIG. 1 is a schematic structural view of the flexible display panel in the embodiment of the present invention, and FIG. 2 is a schematic top view of a display region in the embodiment of the present invention. The flexible display panel shown comprises: a base substrate 10 including a display region and a non-display region, wherein the display region is a region to a left of a dotted line in the figure, in other words, a right side of the dotted line is the non-display region; a pixel circuit 20 disposed on the base substrate 10 and located in the display region, wherein the pixel circuit 20 comprises an active layer 201, a first gate metal layer 202, a second gate metal layer 203, and a first source-drain metal layer 204 disposed in sequence; a buffer layer 301 disposed on a side of the active layer 201 close to the base substrate 10; a first gate insulating layer 302 disposed between the active layer 201 and the first gate metal layer 202; a second gate insulating layer 303 disposed between the first gate metal layer 202 and the second gate metal layer 203; an interlayer dielectric layer 304 disposed between the second gate metal layer 203 and the first source-drain metal layer 204; and a first via hole 401 defined in the display region, wherein the first via hole 401 passes through the buffer layer 301, the first gate insulating layer 302, the second gate insulating layer 303, and the interlayer dielectric layer 304; wherein the first via hole 401 is provided between two adjacent pixel circuits 20.

Compared with the current flexible display panel, the embodiment of the present invention provides the first via hole 401 between the two adjacent pixel circuits 20 in the display region of the base substrate 10. In some embodiments, there is no need to redesign a structure of the pixel circuit 20, and a distance between two adjacent pixel circuits 20 is long enough to directly define holes. In other embodiments, the distance between two adjacent pixel circuits 20 is too short. If necessary, an area occupied by each pixel circuit 20 needs to be reduced to a certain extent. A distance between traces in a same pixel circuit 20 is reduced, and a distance between two adjacent pixel circuits 20 is increased, which leaves a suitable space for defining the first via hole 401, so that the distance between two adjacent pixel circuits 20 is sufficient to form the first via hole 401. When the flexible display panel is bent or rolled, stress is concentrated on the first via hole 401 to prevent the flexible display panel from being creased or damaged due to stress concentration.

Main materials of the buffer layer 301, the first gate insulating layer 302, the second gate insulating layer 303, and the interlayer dielectric layer 304 are silicon oxide or silicon nitride. Inorganic materials such as silicon oxide and silicon nitride have good insulation effects, high hardness, but poor bending resistance. If stresses in different directions are concentrated on the inorganic film layer, the inorganic film layer is likely to be damaged, so the first via hole 401 is not filled or is provided with a first organic filling layer 402, and a material of the first organic filling layer 402 is organic. An improvement is made by defining the first via hole 401, and bending stress is concentrated and released on the first via hole 401 to prevent damaging the film layers. However, for further improvement, an organic substance with excellent bending resistance is disposed in the first via hole 401 to form the first organic filling layer 402, and the bending stress is concentrated on the first organic filling layer 402 to further protect the above inorganic film layer.

The base substrate 10 comprises a first alignment layer 101, a barrier layer 102, a second alignment layer 103, and a light shielding layer 104. The flexible display panel further comprises a planarization layer 501, an anode layer 502, a pixel definition layer 503, and a retaining wall 504. The interlayer dielectric layer 304 comprises a first dielectric layer 3041 and a second dielectric layer 3042. In some embodiments, it further comprises an organic dielectric layer, and the pixel circuit 20 further comprises a via 205.

On the basis of the foregoing embodiment, a surface of the first organic filling layer 402 is covered with a passivation layer 403. The passivation layer 403 has hydrophilic substances or groups and/or hydrophobic substances or groups, such as inorganic materials including silicon nitride, silicon oxide, single crystal silicon, germanium, zirconium oxide, etc., which can also be composed of organic materials with hydrophilic groups such as carboxyl and hydroxyl groups. The passivation layer 403 can not only isolate moisture but can also planarize the first organic filling layer 402, so that the planarization layer 501 provided on the first organic filling layer 402 has a better adhesion effect.

In some embodiments, the first via hole 401 is defined between only part of the two adjacent pixel circuits 20. At this time, there is an improvement effect. More preferably, when the flexible display panel has sufficient space, the flexible display panel comprises a plurality of the first via holes 401, and at least one of the first via holes 401 is provided between every two adjacent pixel circuits.

In some embodiments, the first via hole 401 is a continuous strip hole or a rectangular hole, and a cross-sectional shape of the first via hole 401 is an inverted trapezoid that is wide at top and narrow at bottom. An expanded state of the base substrate 10 comprises two long sides and two short sides. In the embodiment, the first via hole 401 partially or fully passes through the base substrate 10 along a direction perpendicular to the long side. In another embodiment, the flexible display panel comprises a plurality of the first via holes 401 arranged in parallel. The greater the number of the first via holes 401, the better the bending resistance of the entire flexible display panel, but it will compress the space of the pixel circuit 20 too much, which may easily cause problems such as short circuits. Hence, a specific number needs to be determined according to an actual demand of production.

In other embodiments, the flexible display panel further comprises a third via hole disposed in a region where the pixel circuit 20 is located. The third via hole is located between the traces of the same pixel circuit 20. Because the third via hole cannot affect trace directions, an area of the third via hole is usually less than an area of the first via hole 401, and a distribution is irregular, processing is complicated, and effect of dispersing stress is far less than that of the first via hole 401. In a case of limited space, it is better to retain the first via hole 401. Only when a gap between the traces of the pixel circuit 20 is large, the first via hole 401 and the third via hole are selected at the same time to further improve the bending resistance of the flexible display panel.

Further optimizing, circuits are prone to damages after the flexible display panel undergoes a bending process. The base substrate 10 further comprises the non-display region, and the non-display region is the region to the right of the dotted line in FIG. 1. A plurality of second via holes 601 are defined in the non-display region, and a second organic filling layer 602 is disposed in the plurality of second via holes 601. In some embodiments, the second organic filling layer 602 is flush with the second via hole 601. In other embodiments, the second organic filling layer 602 only covers an inner wall of the second via hole 601. An outer wall of the second organic filling layer 602 is in contact with the inner wall of the second via hole 601. The inner wall of the second organic filling layer 602 is also porous. An inner wall surface of the second organic filling layer 602 is covered with a second source-drain metal layer 603, which is similar to the second organic filling layer 602. An outer wall of the second source-drain metal layer 603 is in contact with the inner wall surface of the second organic filling layer 602. The second source-drain metal layer 603 comprises a platform section and a U-shaped section, which can reduce a concentration of bending stress and enhance the bending resistance of the flexible display panel.

Figure 3:
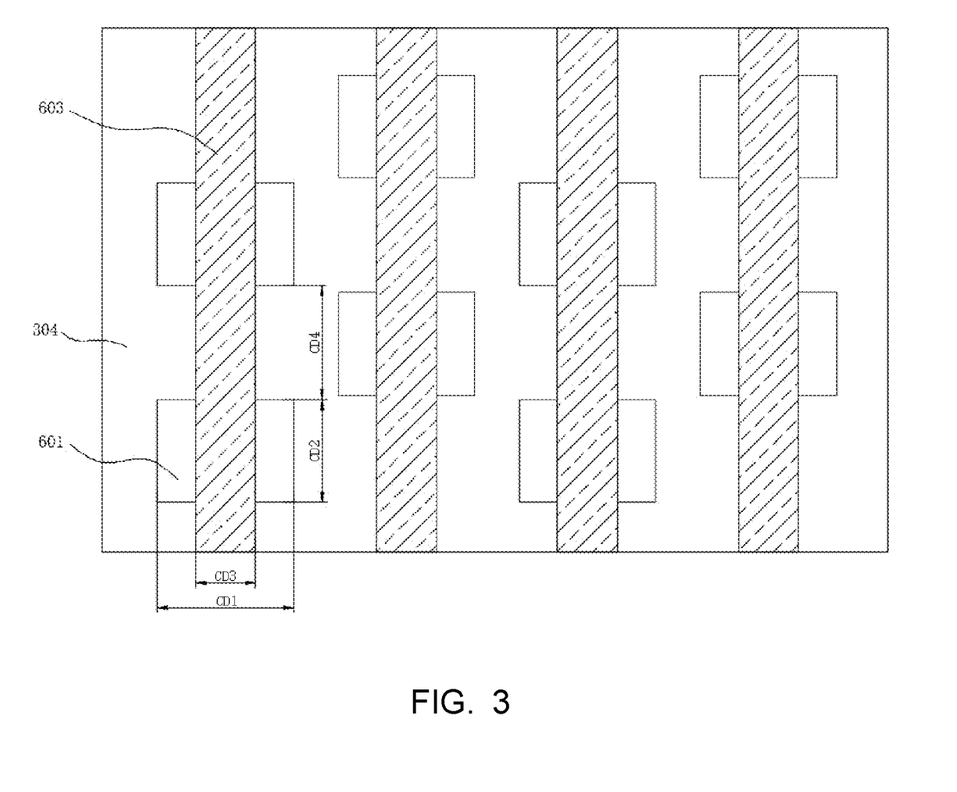
FIG. 3 is a schematic top view of a non-display region in the embodiment of the present invention.

On the basis of the foregoing embodiment, as shown in FIG. 3, FIG. 3 is a schematic plan view of the non-display region in the embodiment of the present invention. Each of the second source-drain metal layers 603 corresponds to a plurality of second via holes 601 in a same column, and a width of the second via holes 601 is greater than a width of the second source-drain metal layer 603, and a length of the second via hole 601 is greater than a distance between adjacent second via holes 601. In a specific embodiment, the width of the second via hole 601 is CD1, the length of the second via hole 601 is CD2, the width of the second source-drain metal layer 603 is CD3, and the distance between any two adjacent second via holes 601 in the same column is CD4. Among them, CD1>CD3, CD2>CD4, preferably, CD1=9.8 um, CD2=8 um, CD3=7.4 um, and CD4=4 um.

In addition, an arrangement of the second via hole 601 can also be optimized. The plurality of second via holes 601 are arranged in staggered intervals, that is, the plurality of second via holes 601 in adjacent rows or columns are interlaced with each other in the columns or the rows, forming a wave shape similar to a three-dimensional spring.

Figure 4:
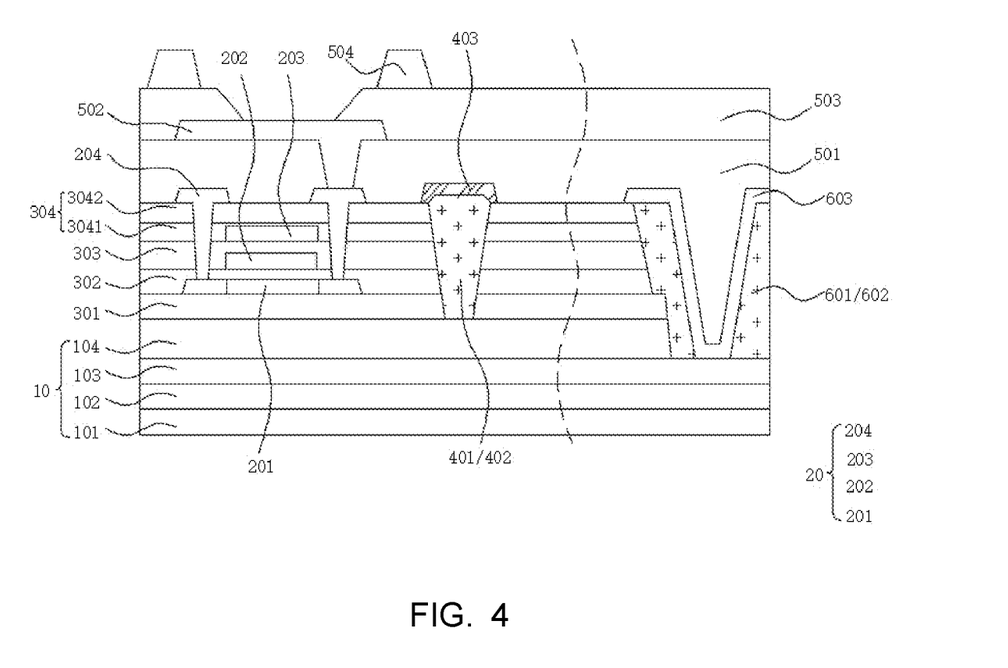
FIG. 4 is a schematic structural view of the flexible display panel in another embodiment of the present invention.

As shown in FIG. 4, FIG. 4 is a schematic structural view of the flexible display panel in another embodiment of the present invention. The flexible display panel comprises the base substrate 10 including the display region and the non-display region. The display region is the region to the left of the dotted line in the figure. In other words, the right side of the dotted line is the non-display region. At least one first via hole 401 is adjacent to a side of the non-display region. When the flexible display panel has sufficient space, a periphery of the base substrate 10 is the non-display region. Except that a portion of the first via hole 401 is provided between two adjacent pixel circuits 20, another portion of the first via hole 401 is adjacent to a side of the non-display region, that is, the portion of the first via hole 401 is disposed in the display region close to the non-display region.

In order to better implement the flexible display panel in the embodiment of the present invention, on the basis of the flexible display panel, the embodiment of the present invention further provides a rollable display device. The rollable display device comprises a rotating shaft and the flexible display panel as described in the above embodiments.

A number and density of the first via holes 401 on a side close to the rotating shaft are greater than or equal to a number and density of the first via holes 401 on a side away from the rotating shaft. When the rollable display device is rolled, an inner layer receives a greater bending stress than an outer layer. Therefore, when the rollable display device is in an unfolded state, the number and density of the first via holes 401 on the side close to the rotating shaft are greater than or equal to the number and density of the first via holes 401 on the side away from the rotating shaft. Therefore, when the rollable display device is in a rolled state, the number and density of the first via holes 401 in the inner layer close to the rotating shaft are greater than or equal to the first via holes 401 in the outer layer away from the rotating shaft, which further improve the bending resistance of the rollable display device.

In the above embodiments, the description of each embodiment has its own emphasis. For parts that are not described in detail in a certain embodiment, please refer to the detailed description of other embodiments above, which will not be repeated here. In specific implementation, each of the above units or structures can be implemented as independent entities, or can be combined arbitrarily, and implemented as the same or several entities. For the specific implementation of the above units, structures or operations, please refer to the previous method embodiments, which will not be repeated here.

The embodiments of the present invention are described in detail above. In this article, specific examples are used to explain the principles and implementation of the present invention. The description of the above embodiments is only used to help understand the technical solutions and core ideas of the present invention. Meanwhile, for those skilled in the art, according to the idea of the present invention, there will be changes in the specific implementation and application scope. In summary, the content of the specification should not be construed as a limitation of the present invention.

What is claimed is:

1. A flexible display panel, comprising:
a base substrate, comprising a display region;
a pixel circuit disposed on the base substrate and located in the display region, wherein the pixel circuit comprises an active layer, a first gate metal layer, a second gate metal layer, and a first source-drain metal layer disposed in sequence;
a buffer layer disposed on a side of the active layer close to the base substrate;
a first gate insulating layer disposed between the active layer and the first gate metal layer;
a second gate insulating layer disposed between the first gate metal layer and the second gate metal layer;
an interlayer dielectric layer disposed between the second gate metal layer and the first source-drain metal layer; and
a first via hole defined in the display region, wherein the first via hole passes through the buffer layer, the first gate insulating layer, the second gate insulating layer, and the interlayer dielectric layer;
wherein at least one of the first via holes is provided between two adjacent pixel circuits.

2. The flexible display panel as claimed in claim 1, wherein the first via hole is not filled or is provided with a first organic filling layer, and a material of the first organic filling layer is organic.

3. The flexible display panel as claimed in claim 1, wherein a surface of a first organic filling layer is covered with a passivation layer.

4. The flexible display panel as claimed in claim 1, wherein the first via hole is a continuous strip hole or a rectangular hole.

5. The flexible display panel as claimed in claim 1, wherein the base substrate further comprises a non-display region, and at least one of the first via holes is adjacent to a side of the non-display region.

6. The flexible display panel as claimed in claim 1, wherein the base substrate further comprises a non-display region, a plurality of second via holes are defined in the non-display region, and a second organic filling layer is disposed in the plurality of second via holes.

7. The flexible display panel as claimed in claim 6, wherein the second organic filling layer covers an inner wall of the second via holes, and a surface of the second organic filling layer is covered with a second source-drain metal layer.

8. The flexible display panel as claimed in claim 7, wherein each of the second source-drain metal layers corresponds to the plurality of second via holes in a same column, a width of the second via holes is greater than a width of the second source-drain metal layer, and a length of the second via holes is greater than a distance between adjacent second via holes.

9. The flexible display panel as claimed in claim 6, wherein the plurality of second via holes on adjacent rows or columns are interleaved with each other on the columns or the rows.

10. A rollable display device, comprising a rotating shaft and a flexible display panel, wherein the flexible display panel comprises:
   a base substrate comprising a display region;
   a pixel circuit disposed on the base substrate and located in the display region, wherein the pixel circuit comprises an active layer, a first gate metal layer, a second gate metal layer, and a first source-drain metal layer disposed in sequence;
   a buffer layer disposed on a side of the active layer close to the base substrate;
   a first gate insulating layer disposed between the active layer and the first gate metal layer;
   a second gate insulating layer disposed between the first gate metal layer and the second gate metal layer;
   an interlayer dielectric layer disposed between the second gate metal layer and the first source-drain metal layer; and
   a first via hole defined in the display region, wherein the first via hole passes through the buffer layer, the first gate insulating layer, the second gate insulating layer, and the interlayer dielectric layer;
   wherein at least one of the first via holes is provided between two adjacent pixel circuits.

11. The rollable display device as claimed in claim 10, wherein the first via hole is not filled or is provided with a first organic filling layer, and a material of the first organic filling layer is organic.

12. The rollable display device as claimed in claim 10, wherein a surface of a first organic filling layer is covered with a passivation layer.

13. The rollable display device as claimed in claim 10, wherein the first via hole is a continuous strip hole or a rectangular hole.

14. The rollable display device as claimed in claim 10, wherein the base substrate further comprises a non-display region, and at least one of the first via holes is adjacent to a side of the non-display region.

15. The rollable display device as claimed in claim 10, wherein the base substrate further comprises a non-display region, a plurality of second via holes are defined in the non-display region, and a second organic filling layer is disposed in the plurality of second via holes.

16. The rollable display device as claimed in claim 15, wherein the second organic filling layer covers an inner wall of the second via holes, and a surface of the second organic filling layer is covered with a second source-drain metal layer.

17. The rollable display device as claimed in claim 16, wherein each of the second source-drain metal layers corresponds to the plurality of second via holes in a same column, a width of the second via holes is greater than a width of the second source-drain metal layer, and a length of the second via holes is greater than a distance between adjacent second via holes.

18. The rollable display device as claimed in claim 15, wherein the plurality of second via holes on adjacent rows or columns are interleaved with each other on the columns or the rows.

* * * * *